(12) United States Patent
Uetake et al.

(10) Patent No.: US 7,539,385 B2
(45) Date of Patent: May 26, 2009

(54) OPTICAL SEMICONDUCTOR DEVICE AND FABRICATION PROCESS THEREOF

(75) Inventors: Ayahito Uetake, Kawasaki (JP);
Tatsuya Takeuchi, Nakakoma-gun (JP)

(73) Assignees: Fujitsu Limited, Kawasaki (JP);
Eudyna Devices Inc., Nakakoma (JP)

( * ) Notice: Subject to any disclaimer, the term of this patent is extended or adjusted under 35 U.S.C. 154(b) by 0 days.

(21) Appl. No.: 11/979,136

(22) Filed: Oct. 31, 2007

(65) Prior Publication Data
US 2008/0175549 A1    Jul. 24, 2008

(30) Foreign Application Priority Data
Jan. 19, 2007    (JP) ............... 2007-010235

(51) Int. Cl.
*G02B 6/10* (2006.01)
(52) U.S. Cl. .................. 385/132; 385/129; 385/131; 438/31
(58) Field of Classification Search .......... 385/129–132
See application file for complete search history.

(56) References Cited
U.S. PATENT DOCUMENTS

| | | | |
|---|---|---|---|
| 5,841,929 A * | 11/1998 | Komatsu et al. | 385/129 |
| 6,030,452 A | 2/2000 | Takeuchi | 117/104 |
| 6,949,394 B2 | 9/2005 | Kobayashi et al. | 438/34 |
| 2005/0129368 A1 | 6/2005 | Kang et al. | 385/50 |

FOREIGN PATENT DOCUMENTS

| | | |
|---|---|---|
| JP | 2003-69149 | 3/2003 |
| JP | 2003-069149 | 3/2003 |
| JP | 2005-223300 | 8/2005 |

OTHER PUBLICATIONS

Yamakoshi S., et al.: "INGAASP/INP Flat-Surface BH Laser Embedded With Iron-Doped SI-INP", European Conference on Optical Communication, Barcelona, Sep. 22-25, 1986, vol. 1, Conf. 12, pp. 41-44.

Byeong Hoon Park, et al.: "Investigation of Optical Feedback in High-Speed Electroabsorption Modulated Lasers With a Window Region", IEEE Photonics Technology Letters, IEEE Service Center, vol. 17, No. 4, Apr. 2005, pp. 1041-1135.

* cited by examiner

*Primary Examiner*—Charlie Peng
(74) *Attorney, Agent, or Firm*—Kratz, Quintos & Hanson, LLP (57) ABSTRACT

An optical semiconductor, includes a semiconductor substrate having a (100) principal surface, a waveguide mesa stripe formed on a first region of the semiconductor substrate, the waveguide mesa stripe guiding a light therethrough; a plurality of dummy mesa patterns formed on the semiconductor substrate in a second region at a forward side of the first region, and a semi-insulating buried semiconductor layer formed on the semiconductor substrate so as to cover the first and second regions continuously, the semi-insulating buried semiconductor layer filling a right side and a left side of the waveguide mesa stripe in the first region and a gap between the plurality of dummy mesa patterns in the second region.

19 Claims, 7 Drawing Sheets

OPTICAL SEMICONDUCTOR DEVICE AND FABRICATION PROCESS THEREOF

CROSS-REFERENCE TO RELATED APPLICATION

The present application is based on Japanese priority application No. 2007-010235 filed on Jan. 19, 2007, the entire contents of which are hereby incorporated by reference.

BACKGROUND OF THE INVENTION

The present invention generally relates to semiconductor devices and more particularly to an optical semiconductor device including semiconductor optical amplifier, laser diode, optical modulator, and the like.

In optical communication networks, there is a demand for the optical semiconductor device used therein such as a semiconductor optical amplifier, laser diode, optical modulator, and the like, in that the optical semiconductor device operates stably and at high speed. In the optical semiconductor device that includes therein an optical amplification part such as semiconductor optical amplifier or laser diode, in particular, reflection caused at the exit end surface serving for optical window tends to invite adversary effect on the stable operation thereof due to amplification of the feedback light caused by the reflection, and thus, it has been practiced in the optical semiconductor devices used in conventional optical telecommunication networks to provide an anti-reflection structure at such an exit end surface. Similar problem arises also in the optical modulator that includes an optical absorption layer.

Patent Reference 1
    Japanese Laid-Open Patent Application 2003-69149

Patent Reference 2
    Japanese Laid-Open Patent Application 2005-223300

Patent Reference 1 discloses a laser diode of the construction that includes an active region and in which there is further provided an anti-reflection structure at an exit end surface of the mesa stripe forming an optical waveguide structure.

In Patent Reference 1, the regions at both lateral sides of the mesa stripe are buried with a semiconductor stack structure that includes therein a p/n carrier blocking layer, wherein there is formed an optical window region at the forward end of the mesa stripe as a part of the waveguide structure constituted by the mesa stripe, with a shape such that the height of the optical window region increases in the forward direction from the forward end of the mesa stripe. It should be noted that such an optical window region is formed by using a mask pattern of the shape that increases a width in the forward direction from the forward end of the mesa stripe.

With the laser diode of such a structure, the laser beam exited from the mesa stripe at the forward end thereof increases the beam diameter when the laser beam has entered into the foregoing optical window region. As a result of such increase of the beam diameter, it becomes possible to decrease the proportion of the light injected back into the mesa stripe after causing reflection and forming a backward light, even when the laser beam is reflected back at the exit end surface of the optical window region.

On the other hand, with the construction of the Patent Reference 1, there arises a problem, in view of the fact that the regions at the lateral sides of the mesa structure constituting the laser diode are buried with the p/n carrier blocking layers, in that there is caused an increase of parasitic capacitance. It should be noted that such increase of the parasitic capacitance invites difficulty for the laser diode to operate at high speed.

Further, with the construction of Patent Reference 1, the direction of extension of the mesa stripe formed on the (100) surface is limited in the [011] directions. When there is caused a minute deviation from these specific directions, there arises a problem that the buried layers form eaves defined by the (111)A surface on the mesa stripe by growing in the direction to face each other.

Figure 1:
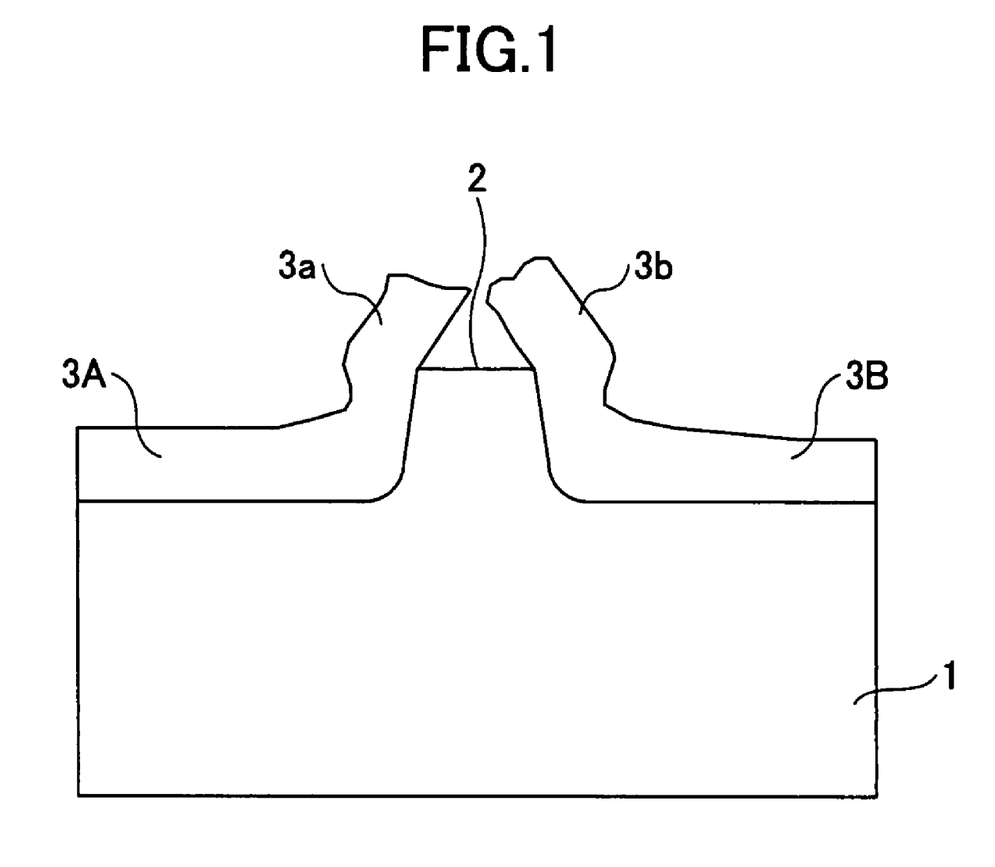
FIG. 1 is a diagram explaining a conventional art and the problems therein.

FIG. 1 shows an example of such eaves.

Referring to FIG. 1, there is formed a mesa stripe 2 on a substrate 1 of InP, or the like, such that the mesa stripe 2 extends in the <0-11> direction, for example. At both lateral sides of the mesa structure 2, there are formed buried layers 3A and 3B of InP, or the like.

With such a structure, the buried layers 3A and 3B creep up over the mesa stripe 2 from both lateral sides thereof, and thus, there the buried layers 3A and 3B form eaves 3a and 3b. Thereby, it should be noted that each of the eaves 3a and 3b has a surface of (111)A orientation at the lower side thereof facing the top surface of the mesa stripe. There are cases in which such eaves 3a and 3b extend up to the height of 1 µm or more, for example in the waveguide of so-called high-mesa structure, in which the height of the mesa stripe is increased for suppressing reflection of the light guided through the mesa stripe by the top surface of the mesa stripe.

Thus, with the laser diode of Patent Reference 1, the extension direction of the mesa stripe is restricted strictly in the [011] directions, and there is no degree of freedom in the design of the laser diode. Further, with such a laser diode, there is a tendency that the yield of production is degraded.

On the other hand, Patent Reference 2 teaches that such formation of eaves can be suppressed when a material of organic chlorine-containing substance is added at the time of deposition of the buried layer.

Thus, the inventor of the present invention has conducted a series of experiments for suppressing the formation of eaves in the investigation that constitutes the foundation of the present invention, by forming the buried layers by an MOCVD process while adding organic chlorine-containing substance at the time of burying the mesa stripe of the optical semiconductor device with a buried layer. With this investigation, a semi-insulating semiconductor layer doped with an element that forms a deep impurity level is used for the buried layer for the purpose of improving the operational speed of the optical semiconductor device.

Figure 2A:
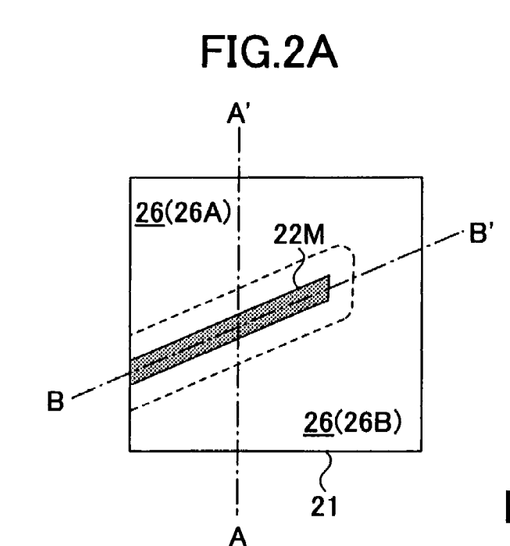
FIGS. 2A-2C are diagrams explaining the problems addressed by the present invention.
Figure 2B:
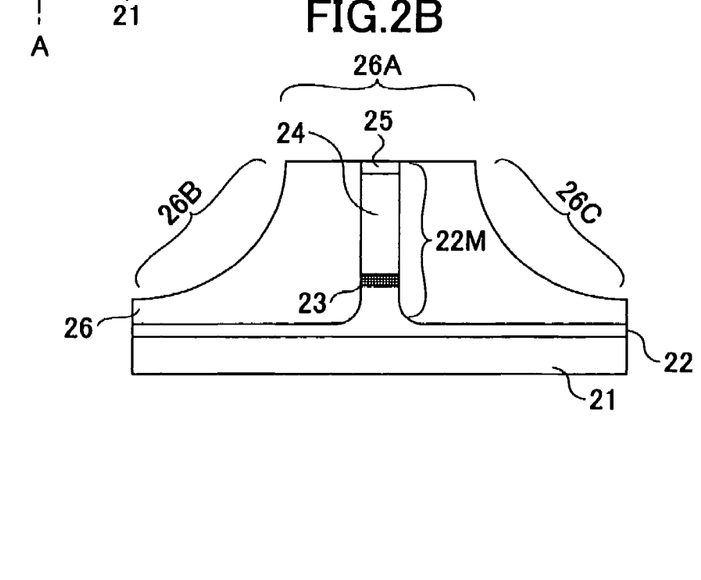
Figure 2C:
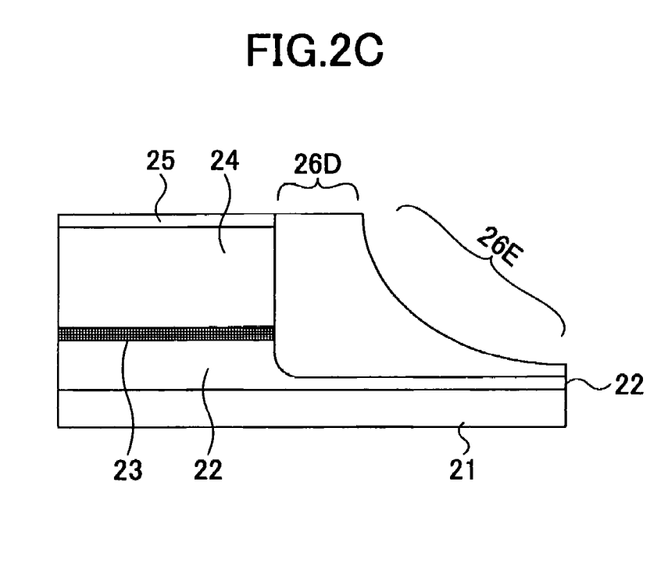

FIGS. 2A-2C show an optical semiconductor structure obtained with the foregoing experiments. In the drawings, FIG. 2A shows a plan view diagram, while FIG. 2B shows a cross-sectional diagram taken along a line A-A' shown in FIG. 2A. Further, FIG. 2C shows a cross-sectional diagram taken along a line B-B' shown in FIG. 2A.

Referring to the cross-sectional diagrams of FIGS. 2B and 2C at first, the optical semiconductor device is formed on an InP substrate 21 of n-type, and there is formed an InGaAsP active layer 23 on a lower cladding layer 22 of n-type InP, and an upper cladding layer 24 of p-type InP is formed further on the foregoing InGaAsP active layer 23. Further, there is formed a contact layer of p-type InGaAs on the upper cladding layer 24.

Further, a mesa stripe 22M is formed so as to reach the lower cladding layer 22 by patterning the layered structure thus formed, and there are formed semi-insulating InP buried layers 26 doped with Fe at the right side and left side of the mesa stripe 22M. Thereby, as shown in FIG. 2C, the semi-insulating InP buried layer 26 also covers a beam exit end of the mesa stripe 22M.

In this experiment, growth of the semi-insulating InP buried layer 26 is achieved by an MOCVD process, wherein methyl chloride $CH_3Cl$ is added to the source material such as TMIn (trimethyl indium) or phosphine ($PH_3$) used at the time of the MOCVD process. Further, in order to realize the desired semi-insulating nature of the InP buried layer 26 by way of pinning the Fermi level thereof, ferrocene ($Cp_2Fe$) is added.

Thus, by adding the material of the system of organic chloride at the time of deposition of the InP buried layer, movement distance of In atoms and P atoms on the surface of the underlying layer is increased, and there is caused extraordinary increase of growth rate in the lateral direction over the primary growth surface of (311)B surface, or the like. As a result, the InP buried layer 26 grows rapidly in the right and left directions from the mesa stripe 22.

As are result, there is formed a characteristic cross-sectional structure for the InP buried layer 26 as shown in FIG. 2B including a flat part 26A defined by a (100) surface extending along the mesa stripe 22M with a certain width and sloped regions 26B and 26C rapidly decreasing the layer thickness at respective outer sides of the flat part 26A. With such a structure, it is possible to suppress the formation of eaves as shown in FIG. 1 even when the extending direction of the mesa stripe 22M is deviated from the <011> direction.

On the other hand, with the structure formed by such a process, it has been discovered that there occurs a growth that forms a principal growth surface of (411)A surface at the exit end of the mesa stripe 22M as shown in FIG. 2C. Because of the formation of such a sloped part 26E adjacent to the flat part 26D, there arises a problem in that it becomes difficult to inject the optical beam exited from the mesa stripe 22M into the optical waveguide such as an optical fiber in the event an optical window is formed in the exit direction of the mesa stripe 22M.

While formation of such a sloped part 26D can be resolved when the growth of the InP buried layer 26 is continued over a prolonged time, such an approach wastes the source material and tends to invite various problems such as degradation of production throughput, frequent equipment maintenance, and the like. Thus, such an approach is deemed not realistic to mass production of semiconductor devices.

SUMMARY OF THE INVENTION

In a first aspect, the present invention provides an optical semiconductor device, including:

a semiconductor substrate having a (100) principal surface;

a waveguide mesa stripe formed on a first region of said semiconductor substrate and configured to guide a light therethrough;

a plurality of dummy mesa patterns formed on said semiconductor substrate in a second region located at a forward side of said first region; and a semi-insulating buried semiconductor layer formed on said semiconductor substrate so as to cover said first region and said second region continuously, said semi-insulating buried semiconductor layer filling a left side and a right side of said waveguide mesa stripe in said first region and filling a gap formed between said plurality of dummy mesa patterns in said second region, said semi-insulating buried semiconductor layer comprising, in said first region:

flat parts formed along said waveguide mesa stripe at respective left and right sides of said waveguide mesa stripe, said flat parts forming a flat surface at a level coincident to a top surface of said waveguide mesa stripe; and sloped parts formed at respective outer sides of said flat parts with respective thickness decreasing with increasing distance from said waveguide mesa stripe, said semi-insulating buried semiconductor layer filling, in said second region, said gap between said plurality of dummy mesa patterns with a thickness such that a top surface of said semi-insulating buried semiconductor layer does not become lower than a height of said plurality of dummy mesa patterns.

In another aspect, the present invention provides a method for fabricating an optical semiconductor device, said optical semiconductor device including: a semiconductor substrate having a (100) surface; a waveguide mesa stripe formed on a first region of said semiconductor substrate, said waveguide mesa stripe guiding a light therethrough; and a plurality of dummy mesa patterns formed on said semiconductor substrate in a second region located at a forward side of said first region so as to extend in an extending direction of said waveguide mesa stripe, said method comprising the steps of:

depositing a semi-insulating semiconductor layer on said semiconductor substrate by an MOCVD process so as to cover said first region and said second region continuously, such that said semi-insulating buried semiconductor layer fills, in said first region, a right side region and a left side region of said waveguide mesa stripe and such that said semi-insulating buried semiconductor layer fills, in said second region, a gap between said plurality of dummy mesa patterns, said step of depositing said semi-insulating buried semiconductor layer being conducted by adding an organic chlorine-containing substance such that there are formed flat regions in said first region along said waveguide mesa stripe respectively at said right and left regions of said mesa stripe with a flat surface at a level coincident to a top surface of said waveguide mesa stripe, and such that there are formed first and second sloped regions at respective outer sides of said flat regions with respective thicknesses decreasing with increasing distance from said waveguide mesa stripe, said step of depositing said semi-insulating buried semiconductor layer being further conducted such that, in said second region, said semi-insulating buried semiconductor layer fills said gap between said plurality of dummy mesa patterns with a thickness that does not become lower than a height of said plurality of dummy mesa patterns.

DETAILED DESCRIPTION OF THE PREFERRED EMBODIMENTS

First Embodiment

FIGS. 3A-3D show the construction of an optical semiconductor device 40 according to a first embodiment of the present invention.

Figure 3A:
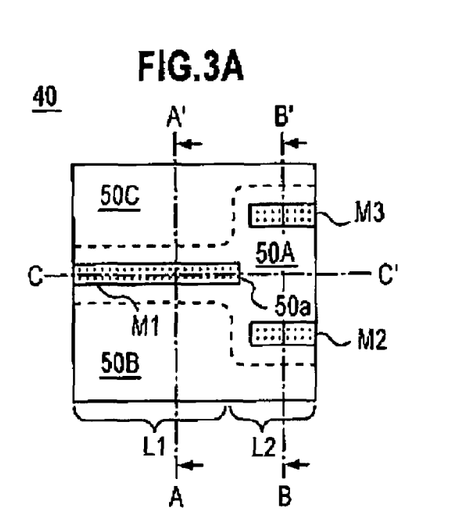
FIGS. 3A-3D are diagrams explaining a first embodiment of the present invention.

Referring to FIGS. 3A-3D, the optical semiconductor device 40 is a semiconductor optical amplifier (SOA) and is constructed on an n-type InP substrate 40 having a (100)

principal surface. Here, it should be noted that FIG. 3A shows the laser diode 40 in a plan view, FIG. 3B shows the laser diode 40 in a cross-sectional view taken along a line A-A' of FIG. 3A, FIG. 3C shows the laser diode 40 in a cross-sectional view taken along a line B-B' of FIG. 3A, while FIG. 3D is a longitudinal cross-sectional view taken along a line C-C' of FIG. 3A.

Figure 3B:
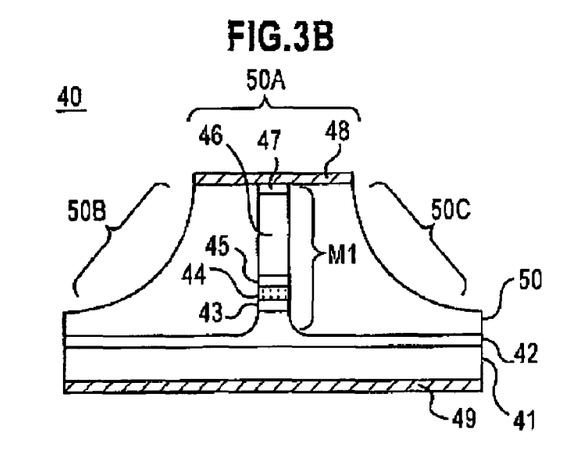
Figure 3C:
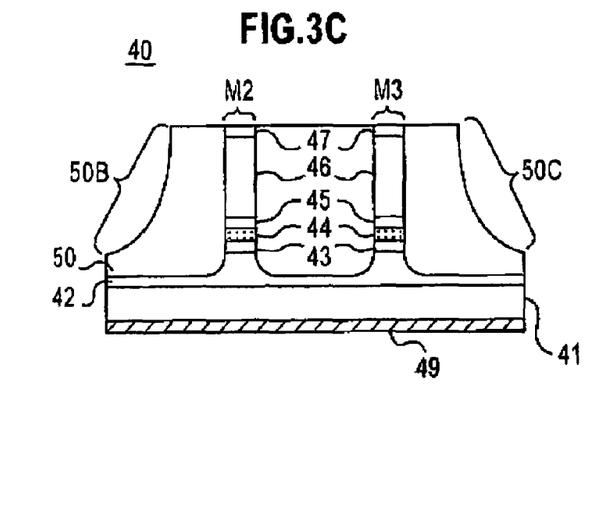
Figure 3D:
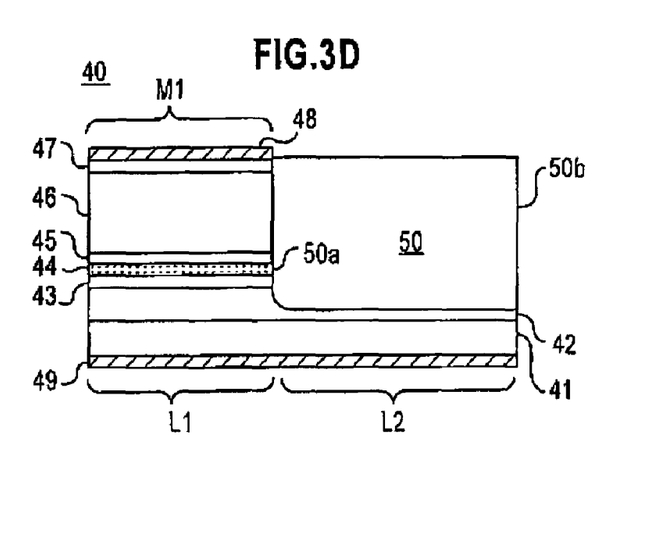

Referring to the cross-sectional view of FIG. 3B at first, there is formed an InP lower cladding layer 42 doped to n-type with the carrier density of $1.0 \times 10^{18}$ cm$^{-3}$ on the n-type InP substrate 41 epitaxially with a thickness of 0.3 μm, for example, and a lower SCH (separate confinement heterostructure) layer 43 of n-type InGaAsP is formed on the lower classing layer 42 with a lattice matching composition to the InP substrate 41, such as the composition of $In_{0.85}Ga_{0.15}As_{0.33}P_{0.67}$, for example, with a bandgap wavelength of 1.1 μm and a thickness of 30 nm.

Further, there is formed an active-layer 44 on the lower SCH layer 43 epitaxially in such a manner that a barrier layer of the composition of $In_{0.78}Ga_{0.22}As_{0.48}P_{0.52}$ having the bandgap wavelength of 1.2 μm and the thickness of 6 nm and a quantum well layer of the composition of $In_{0.56}Ga_{0.44}As_{0.91}P_{0.09}$ having the bandgap wavelength of 1.55 μm and the thickness of 5 nm are stacked alternately and repeatedly for four periods in the active layer 44, and there is formed an upper SCH layer 45 on the active layer 44 epitaxially with the same composition to the lower cladding layer 42 except that the upper SCH layer 45 is doped to p-type.

Further, there is formed an upper cladding layer 46 of p-type InP on the upper SCH layer 45 with a carrier density of $1.0 \times 10^{18}$ cm$^{-3}$ and a thickness of 1.5 μm, for example, and a contact layer 47 of p-type InGaAs is formed on the upper cladding layer with a carrier density of $1.0 \times 10^{19}$ cm$^{-3}$ and a thickness of 0.3 μm.

The semiconductor layered body thus formed on the InP substrate 41 is then processed such that there is formed a mesa stripe M1 in a first region L1 of the InP substrate 41 as shown in FIG. 3A as the active part of the semiconductor optical amplifier with a width of 2 μm, for example and with a height exceeding 2 μm, such as 3 μm.

Referring to the cross-sectional diagram of FIG. 3B, the regions at the right side and the left side of the mesa stripe M1 thus formed are filled with buried layer 50 formed of a semi-insulating InP layer doped with an element that forms a deep impurity level such as Fe. In the present invention, the deposition of such an InP buried layer 50 is conducted by an MOCVD process added with an organic chlorine-containing substance as will be explained later. As a result, the InP buried layer 50 has a shape characterized by a flat top surface defined by a (100) surface at a central region 50A thereof adjacent to the mesa stripe M1 and by sloped regions 50B and 50C at the respective outer regions of the central region 50A, wherein each of the sloped regions 50B and 50C is defined by a primary surface of (311)B similarly to the construction of FIG. 2B, reducing the layer thickness rapidly with increasing distance from the mesa stripe M1.

Further, there is formed a p-side ohmic electrode 48 on the central region 50A in contact with the contact layer 47, and there is further formed an n-side ohmic electrode 49 at the bottom side of the InP substrate 41.

Thus, there occurs optical amplification for the light guided through the mesa stripe M1 in the direction toward the exit end 50a by stimulated emission when holes and electrons are injected from the ohmic electrodes 48 and 49, respectively.

Further, as shown in the plan view diagram of FIG. 3A, there are formed two dummy mesa patterns M2 and M3 of a layered structure identical to the layered structure of the mesa stripe M1 on the InP substrate 41 in a region L2 at a forward side of the region L1, and thus at the forward side of the exit end 50a as shown in FIG. 3C, wherein the dummy mesa stripes M2 and M3 are formed respectively at the left side and right side of a hypothetical extension line of the mesa stripe M1 in symmetry thereto and in parallel to the extending direction of the mesa stripe M1. In the illustrated example, each of the dummy mesa patterns M2 and M3 extends continuously with the width of 2 μm and the height of 3 μm identical to the width and height of the mesa stripe M1 and forms a dummy mesa stripe. It should be noted however, that the present invention is not limited to such a case in which the dummy mesa patterns M2 and M3 are formed of the continuous and parallel dummy mesa stripes. Further, the present invention is not limited to the construction in which the dummy mesa patterns M2 and M3 are disposed in symmetry to the hypothetical extension of the mesa stripe M1.

Thus, the InP buried layer 50 is formed also to fill the regions outside the dummy mesa stripes M2 and M3, and as a result, the sloped regions 50B and 50C are formed in the respective outer regions of the dummy mesa stripes M2 and M3 in continuation from the region L1, wherein it should be noted that the region between the dummy mesa stripes M2 and M3 is filled completely with the InP buried layer 50 up to the uppermost contact layer 47. As a result, the InP buried layer 50 is formed up to the front edge of the InP substrate 41 as shown in the longitudinal cross-sectional view of FIG. 3D and forms an exit end surface 50b of the optical semiconductor device 40 defined by a (011) surface.

In order to obtain the structure in which the InP buried layer 50 fills the gap between the dummy mesa stripes M2 and M3 completely up to the foregoing edge surface 50b, it is preferable to set the separation between the dummy mesa stripes M2 and M3 to 10 μm or more but not exceeding 50 μm, preferably 30 μm, for example. Further, there is no need to form the InP buried layer 50 to have a top surface coincident to the top surface of the dummy mesa stripes M2 and M3 in the gap between the dummy mesa stripes M2 and M3, and it is also possible to increase the height beyond the top surface of the dummy mesa stripes M2 and M3 as long as abnormal growth can be avoided.

Thus, with the optical semiconductor device 40 of FIGS. 3A-3D, the optical beam exited from the exit end 50a of the mesa stripe M1 experiences increase of beam diameter when the optical beam has entered into the InP buried layer 50 formed between the dummy mesa stripes M2 and M3 in the foregoing region L2, and it becomes possible to reduce the proportion of the reflection light that is injected into the mesa stripe M1 as the feedback light even when there is caused reflection at the exit end surface 50b of the optical semiconductor device 40.

In the illustrated example, it should be noted that each of the mesa stripes M1, M2 and M3 extends in any of the [011] directions with the width of 2 μm and has a height exceeding 2 μm. In the present invention, the deposition of the InP buried layer 50 is carried in the state the organic chlorine-containing substance is added. Thus, the extension direction of the mesa stripes M1, M2 and M3 is not limited to the [011] directions and it is possible to avoid abnormal growth of the InP buried layer explained with reference to FIG. 1 even when the extending direction of the mesa stripes M1, M2 and M3 is defined from any of the [011] directions with an arbitrary angle.

While the present invention forms the mesa stripe M1 with the height exceeding 1.5 μm, actually 2 μm or more, for suppressing reflection at the waveguide top surface (so-called "high-mesa structure"), it is possible to suppress the problem of abnormal growth of the InP buried layer explained with reference to FIG. 1 even when such an InP buried layer 50 is used to bury the high-mesa structure, as a result of carrying out the deposition of the InP buried layer 50 in the state added with the organic chlorine-containing substance.

Particularly, it is possible with the present invention to form the structure of FIG. 3D preventing optical feedback even in the case the mesa stripe M1 and the dummy mesa stripes M2 and M3 have an identical width, without increasing the width of the dummy mesa stripes M2 and M3 over the mesa stripe M1 or increasing the width of the dummy mesa stripes M2 and M3 in the direction toward the exit end surface of the optical semiconductor device.

Next the fabrication process of the optical semiconductor device 40 of FIGS. 3A-3D will be explained with reference to FIGS. 4A-4D. In the drawings, the drawing at the left side corresponds to the cross-section of FIG. 3C, while the drawing at the right side corresponds to the cross-section of FIG. 3D.

Figure 4A:
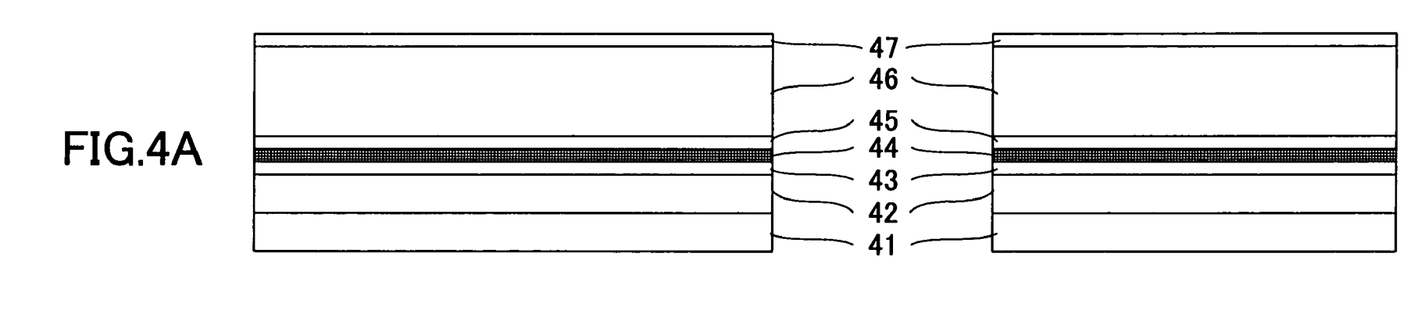
FIGS. 4A-4D are diagrams explaining the fabrication process of an optical semiconductor device of FIG. 3.
Figure 4B:
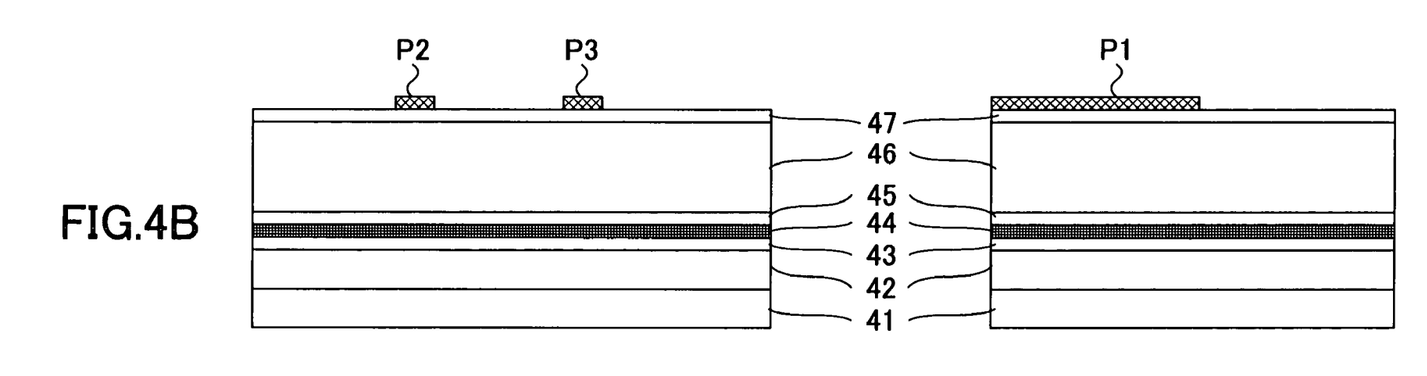

Referring to FIG. 4A, there is formed a layered structure on the (100) principal surface of the n-type InP substrate 41 in which the InP lower cladding layer 42, the lower SCH layer 43, the active layer 44, the upper SCH layer 45, the upper cladding layer 46 and the contact layer 47 are laminated consecutively, and there are formed mask patterns P1-P3 of $SiO_2$ in the step of FIG. 4B in the regions where the mesa stripes M1-M3 are to be formed respectively with a width of 2 μm.

Here, the InP lower cladding layer 42 is formed by an MOCVD process that uses trimethyl indium (TMIn) and phosphine ($PH_3$) for the source materials at a substrate temperature of 600° C., for example, with a growth rate of 2.0 μm/hour such that the InP lower cladding layer 42 has a thickness of 0.3 μm. Thereby, the InP lower cladding layer 42 is doped to n-type with the n-type carrier concentration of $1.0 \times 10^{18}/cm^3$ by adding a $SiH_4$ gas to the source materials as the n-type dopant. Further, the lower SCH layer 43 is formed by an MOCVD process that uses the source materials of TMI, phosphine and trimethyl gallium (TEGa) and arsine ($AsH_3$) with a growth rate of 1.0 μm/hour such that the lower SCH layer 43 has a lattice matching composition such as $In_{0.85}Ga_{0.15}As_{0.33}P_{0.67}$ and a bandgap wavelength of 1.1 μm. Thereby, the supply of the $SiH_4$ doping gas is continued, and thus, the lower SCH layer 43 is doped to n-type.

Further, the active layer is formed by alternately and repeatedly stacking a barrier layer of the composition of $In_{0.78}Ga_{0.22}As_{0.48}P_{0.52}$ providing a bandgap wavelength of 1.2 μm and having a thickness of 6 nm and a quantum well layer of the composition of $In_{0.56}Ga_{0.44}As_{0.91}P_{0.09}$ providing a bandgap wavelength of 1.55 μm and having a thickness of 5 nm for four periods. Further, the upper SCH layer 45 is formed by an MOCVD process with a growth rate of 1.0 μm/hour and a thickness of 30 nm by using the source materials of TMIn, TEGa, phosphine and arsine, so as to have a composition identical to the composition of the lower cladding layer 42, except that the upper SCH layer 45 is doped to p-type by adding dimethyl zinc (DMZn) as the dopant.

Further, the upper cladding layer 46 is formed by an MOCVD process to have a thickness of 1.5 μm and a p-type carrier density of $1.0 \times 10^{18}/cm^3$ while using TMIn and phosphine for the source materials and further adding DMZn for the p-type doping gas.

The contact layer 17 is formed by adding DMZn as the dopant gas to the source materials of TMIn, TEGa and arsine.

Figure 4C:
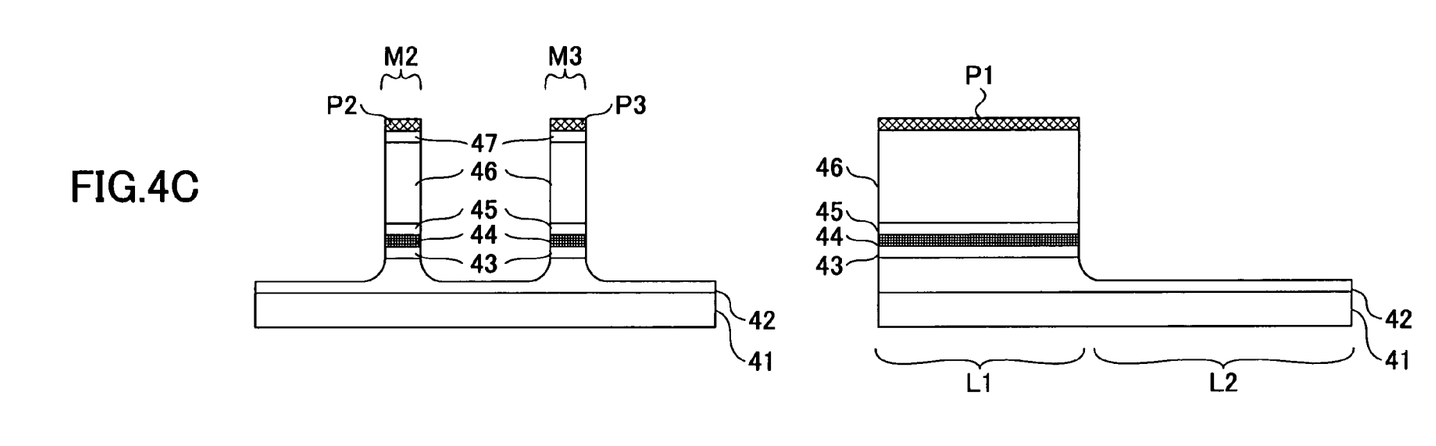

Further, in the step of FIG. 4C, the semiconductor layered structure thus formed is patterned by a dry etching process conducted while using the $SiO_2$ patterns P1-P3 as the mask, and as a result, there are formed mesa stripes M1-M3 with the width of 2 μm.

Figure 4D:
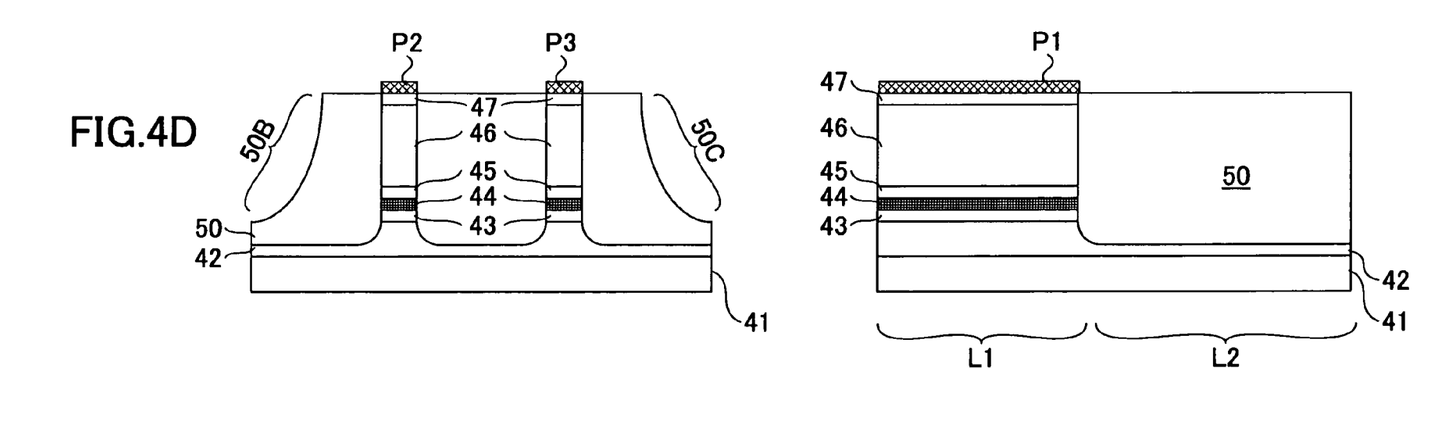

Next, in the step of FIG. 4D, the $SiO_2$ patterns P1-P3 are continuously used as a mask, and the InP buried layer 50 is deposited on the structure of FIG. 4D by an MOCVD process with the growth rate of 2.0 μm/hour when measured on a flat surface, while using TMIn and phosphine for the source materials. Thereby, the present invention adds ferrocene ($Cp_2Fe$) and methyl chloride ($CH_3Cl$) to the foregoing source materials with a flow rate of 20 sccm, for example, for each, and with this, it becomes possible to form the InP buried layer 50 to contain Fe, a deep impurity forming a deep impurity level, with the concentration of $1 \times 10^{17}/cm^3$. It should be noted that Fe thus incorporated into the InP buried layer 50 works as effective carrier killer.

With the present invention, there occurs increase in the dependency of growth rate of the InP layer constituting the InP buried layer 50 upon the surface as a result of addition of methyl chloride at the time of formation of the InP buried layer 50, and growth of the (100) surface or (111)A surface is suppressed. Thus, while there appear sloped regions 50B and 50C in the region L1, it becomes possible to fill the gap between the dummy mesa stripes M2 and M3 completely with the InP layer. Further, while there is formed a primary growth surface of (411)A surface in the InP buried layer 50 in the gap region between the dummy mesa stripes M2 and M3 similarly to the case of FIG. 2C explained before, there is formed no sloped surface like the sloped surface 26E as in the case of FIG. 2C as a result of the growth of the InP buried layer 50 caused from both lateral wall surfaces of the dummy mesa stripes M2 and M3 facing with each other, and it becomes possible to obtain a buried structure having an end surface defined by a (011) crystal surface as shown in FIG. 4D in short time.

Further, after the step of FIG. 4D, the $SiO_2$ mask patterns P1-P3 are removed by a wet processing in HF, and the optical semiconductor device 40 shown in FIGS. 3A-3D is obtained by forming the electrodes 48 and 49 thereon.

As noted previously, it is effective to set the separation between the dummy mesa patterns M2 and M3 to 10 μm or more but not exceeding 50 μm when to fill the gap between the dummy mesa patterns M2 and M3 with the InP buried layer 50.

Second Embodiment

FIGS. 5A-5D show the construction of an optical semiconductor device 60 according to a second embodiment of the present invention. In the drawings, those parts explained before are designated by the same reference numerals and the description thereof will be omitted.

Figure 5A:
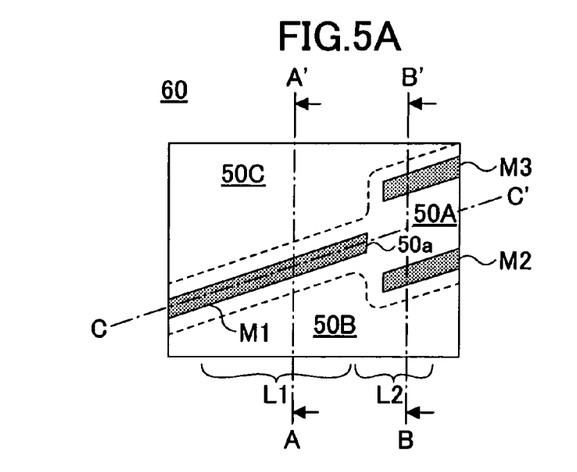
FIGS. 5A-5D are diagrams explaining a second embodiment of the present invention.
Figure 5B:
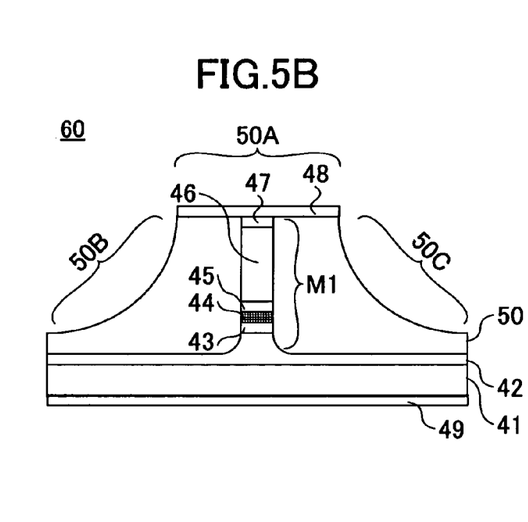
Figure 5C:
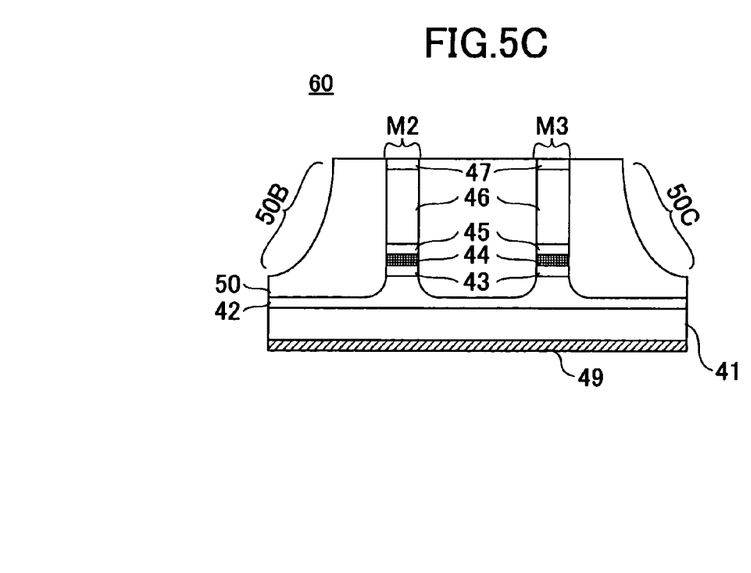
Figure 5D:
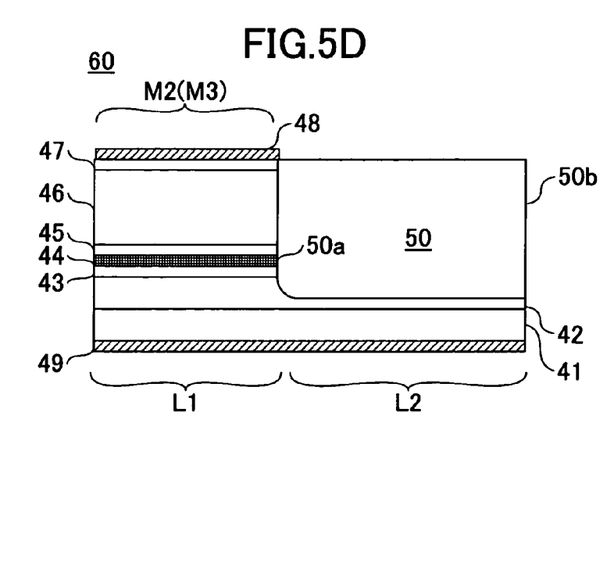

Referring to the plan view diagram of FIG. 5A, each of the mesa stripes M1-M3 is formed on the InP substrate 41 with the direction offset from the [011] direction toward the [0-11] direction by the angle of 10° with the optical semiconductor device 60 of the present embodiment.

Further, with the present embodiment, 1,2 dichloroethylene is added at the time of deposition of the InP buried layer 50 in place of the methyl chloride with a flow rate of 50 sccm.

In the present embodiment, too, the mesa stripes M1-M3 have a width of 2 μm and a height of 3 μm and are formed with a separation of 10 μm or more but not exceeding 50 μm, such as 30 μm, when viewed from the extending direction of the mesa stripe M1. Thereby, the gap between the mesa stripes M2 and M3 is filled with the semi-insulating InP buried layer 50 doped with Fe, with a thickness such that the top surface of the InP buried layer 50 is not lower than the height of the mesa stripes M2 and M3.

With the present embodiment, too, the patterning of the mesa stripes M1-M3 is conducted by using the $SiO_2$ mask similar to the one explained with reference to FIGS. 4C and 4D, and as a result, it becomes possible to form the exit end surface 50a of the mesa stripe M1 to form an oblique angle with regard to the extension direction of the mesa stripe M1. As a result, feedback of the reflection light formed at the exit end surface 50a into the mesa stripe is suppressed and the operation of the optical semiconductor device 60 is stabilized further.

In the present embodiment, it should be noted that the extension direction of the mesa stripes M1-M3 is deviated from the [011] directions, which directions being conventionally believed to be mandatory. Even in such a case, there is caused no abnormal growth of the InP buried layer 50 as explained with reference to FIG. 1.

Figure 6:
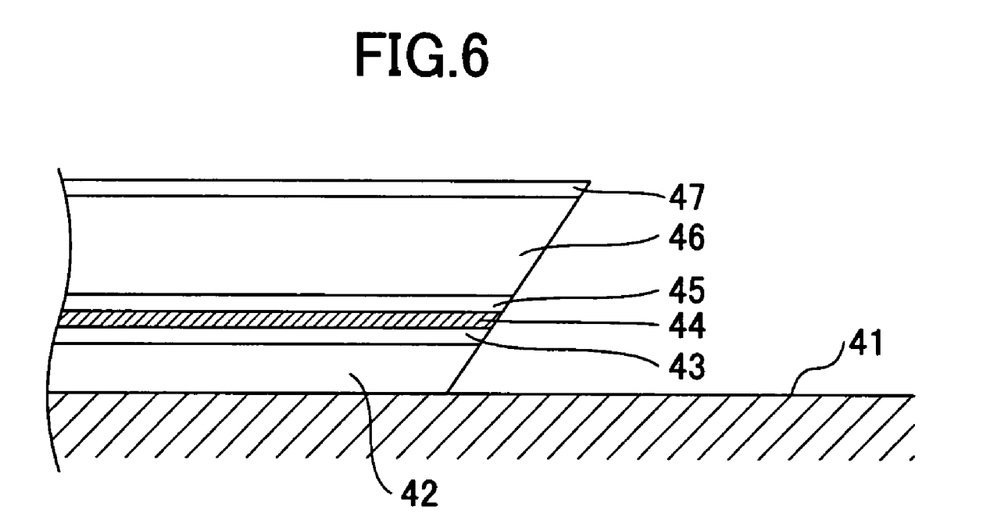
FIG. 6 is a diagram showing a modification the optical semiconductor device of the second embodiment.

Further, it is also possible with the present invention to form the exit end surface 50a of the mesa stripe M1 to have an elevational cross-section shown in FIG. 6 by optimizing the dry etching condition at the time of patterning the mesa stripes M1-M3.

According to the present invention, a (011) surface of InP or a surface near the (011) surface is obtained at the end of the InP substrate 41 as the exit end surface of light, and coupling of the optical semiconductor device to an optical waveguide such as an optical fiber or other optical semiconductor devices is attained easily. Further, the optical wave guided through the mesa stripe M1 in the region L1 increases the beam diameter thereof in the region L2 as it propagates through the InP buried layer 50, and as a result, it becomes possible to suppress the proportion of the feedback light reflected back at the optical exit surface 50b and injected back into the mesa stripe M1 is reduced. Thereby, stability of the optical communication system is improved. Further, the InP buried layer 50 of the mesa stripe M1, being formed of semi-insulating InP, is free from a p/n junction, and thus, the optical semiconductor device can operate at high speed exceeding 10 Gbps.

While the forging explanation has been made for the case the optical semiconductor device is a semiconductor optical amplifier, present invention is applicable widely to various optical semiconductor devices such as a laser diode or optical modulator that has a waveguide mesa stripe structure on a substrate. For example, it is possible to form a laser diode simply by forming a diffraction grating upon the upper or lower SCH layer. Further, it is easily possible to construct an optical modulator by providing an optical absorption layer for the active layer.

Further, while the foregoing embodiments have been explained for the case of using methyl chloride or 1,2-dichloroethylene for the organic chlorine-containing substance, similar effects can be attained also when using substances such as ethyl chloride, 1,2-dichloroethane, 1,2-dichloropropane, and the like, for the organic chlorine-containing material.

Further, while the foregoing embodiments have been explained for the case the dummy mesa patterns M2 and M3 form a dummy mesa stripe extending continuously on the InP substrate, there is no need in the present invention that the dummy mesa patterns M2 and M3 form such continuous mesa stripe. Further, there is no need that such dummy patterns extend parallel with each other.

Further, with the foregoing embodiments, explanation has been made for the case the dummy mesa patterns are formed in symmetry to the hypothetical extension line of the mesa stripe M1 at the left side and the right side, it is also possible to form the dummy mesa patterns M2 and M3 in asymmetry to the hypothetical extension of the mesa stripe M1.

Further, while explanation has been made in the embodiments described heretofore that the dummy mesa patterns M2 and M3 have the width identical to the width of the mesa stripe M1, the dummy mesa patterns M2 and M3 may have a width smaller than the width of the mesa stripe M1, as long as the gap between the dummy mesa patterns M2 and M3 is filled with the semi-insulating buried layer.

Further, the dummy mesa patterns may have a height different from the height of the waveguide mesa stripe and may have a layered structure different from the layered structure of the waveguide mesa stripe.

Further, while explanation has been made in the foregoing embodiments for the case in which only a pair of dummy patterns are provided, three or more dummy patterns may also be provided.

Further, while explanation has been made heretofore for the case of using a Fe-doped InP layer for the semi-insulating buried layer 50, it is also possible to use a Ru-doped InP layer or a Ti-doped InP layer for this purpose. In the case of Fe-doped InP layer or Ru-doped InP layer, the InP layer shows insulating nature because of trapping of electrons thereon, while a Ti-doped InP layer shows the insulating nature as a result of trapping of holes.

Further, while the foregoing embodiments explain the case that uses InGaAsP for the quantum well layer and the barrier layer, it is also possible with the present invention to use a mixed crystal such as AlGaInAs, AlGaInP, InGaAs, InGaAsSb, and the like.

According to the present invention, in which the waveguide mesa stripe for guiding a light is formed on the first region of the semiconductor substrate having the (100) surface, the plurality of dummy patterns being formed on the semiconductor substrate in the second region at the forward side of the first region, the semi-insulating semiconductor layer being deposited on the semiconductor substrate by an MOCVD process so as to cover the first and second regions continuously such that the semi-insulating buried semiconductor layer fills the right side and left side of the waveguide mesa stripe in the first region and such that the semi-insulating buried semiconductor layer fills the gap between the plurality of dummy mesa patterns in the second region, the deposition of the semi-insulating buried semiconductor layer being conducted in the state added with an organic chlorine-containing substance, it becomes possible to form the flat regions along the waveguide mesa stripe respectively at the right side and the left side thereof with a height coincident to the top surface of the waveguide mesa stripe. Further, the sloped parts are formed at respective outer sides of the flat part with the respective thicknesses that decrease with increasing distance from the waveguide mesa stripe. Thus, while there appears the tendency that the thickness of the semi-insulating buried semiconductor layer is decreased in the second region at the forward side of the waveguide mesa stripe in the direction toward the exit end also with the present invention in view of the fact that organic chlorine-containing substance is added at the time of deposition of the semi-insulating buried semiconductor layer, the present invention can increase the layer thickness of the semi-insulating buried semiconductor layer in the second region as a result of rapid lateral growth caused from the dummy mesa patterns at the both lateral sides of the waveguide mesa stripe in view of the construction thereof of providing a plurality of dummy mesa patterns in the foregoing second region. Thereby, it becomes possible to fill the gap between the plurality of dummy mesa patterns with the semi-insulating buried semiconductor layer with the thickness such that the top surface of the semi-insulating buried semiconductor layer is located at a height not lower than a height of the foregoing plurality of dummy mesa patterns. As a result, abnormal growth of the semi-insulating buried semiconductor layer is suppressed effectively as a result of use of the organic chlorine-containing substance even in the case the extending direction of the waveguide mesa stripe is deviated from the [011] directions, and it becomes possible to form an optical feedback suppressing structure suppressing the exit light exit from the waveguide mesa stripe being re-injected into the waveguide structure as feedback light as a result of reflection. Such an anti-reflection structure maintains a certain layer thickness up to the exit end of the semiconductor device, and thus, it becomes possible to reduce the optical loss when the optical semiconductor device is coupled to other optical waveguide or other optical semiconductor device via such an anti-reflection structure.

Further, with the present invention, the buried layers filling the regions at the left side and right side of the waveguide mesa stripe is formed of a semi-insulating semiconductor layer free from a p/n junction, and thus, there arises no problem of degradation of operational speed of the optical semiconductor device caused by parasitic capacitance. Thus, the optical semiconductor device of the present invention operates at high speed.

While the present invention has been explained for preferred embodiments, the present invention is not limited to such specific embodiments and various variations and modifications may be made within the scope of the invention described in patent claims.

What is claimed is:

1. An optical semiconductor device, comprising:
a semiconductor substrate having a (100) principal surface;
a mesa stripe waveguide formed on a first region of said semiconductor substrate, said mesa stripe waveguide guiding a light therethrough in a forward direction to an end face of said mesa stripe waveguide, said mesa stripe waveguide amplifying a light guided therethrough by stimulated emission;
a plurality of dummy mesa patterns, that do not actively amplify light, formed on said semiconductor substrate in a second region having an exit facet, said second region being located at a forward side of said first region, said exit facet determining an edge surface of said optical semiconductor device, each of said plurality of dummy mesa patterns extending to said exit facet, a gap being formed between said plurality of dummy mesa patterns in said second region; and
a semi-insulating buried semiconductor layer formed on said semiconductor substrate so as to cover said first and second regions continuously, said semi-insulating buried semiconductor layer filling a right side and a left side of said waveguide mesa stripe in said first region;
said semi-insulating buried semiconductor layer having a height equal to a height of said dummy mesa patterns.

2. The optical semiconductor device as claimed in claim 1, wherein said semi-insulating buried semi conductor layer comprises, in said first region: flat regions formed along said mesa stripe waveguide respectively at said right side and left side thereof, said flat regions having a flat top surface coincident to a top surface of said mesa stripe waveguide; and sloped regions formed at respective outer sides of said flat regions at said left side and said right side, each of said sloped regions having a thickness decreasing with increasing distance from said mesa stripe waveguide, said semi-insulating buried semiconductor layer filling, in said second region, said gap between said plurality of dummy mesa patterns such that a top surface of said semi-insulating buried semiconductor layer is at a height not lower than a height of said plurality of dummy mesa patterns.

3. The optical semiconductor device as claimed in claim 1, wherein each of said plurality of dummy mesa patterns has a width identical to a width of said mesa stripe waveguide.

4. The optical semiconductor device as claimed in claim 1, wherein said semi-insulating buried semiconductor layer has a top surface of (100) surface in said first region.

5. The optical semiconductor device as claimed in claim 1, wherein said plurality of dummy mesa patterns extend in said second region parallel to an extending direction of said mesa stripe waveguide and form a dummy mesa stripe.

6. The optical semiconductor device as claimed in claim 1, wherein said mesa stripe waveguide extends over said semiconductor substrate in any of [011] directions.

7. The optical semiconductor device as claimed in claim 1, wherein said mesa stripe waveguide extends over said semiconductor substrate a direction offset from any of [011] directions.

8. The optical semiconductor device as claimed in claim 1, wherein said semi-insulating buried semiconductor layer is doped with an element that forms a deep impurity level.

9. The optical semiconductor device as claimed in claim 1, wherein said plurality of dummy mesa patterns are formed at a forward side to a top end of said mesa stripe waveguide.

10. The optical semiconductor device as claimed in claim 1, wherein said tip end of said mesa stripe waveguide forms an oblique surface crossing obliquely to an extension direction of said mesa stripe waveguide.

11. The optical semiconductor device as claimed in claim 10, wherein said oblique surface crosses obliquely to said extending direction of said mesa stripe waveguide when viewed from a direction perpendicular to said principal surface of said semiconductor substrate.

12. The optical semiconductor device as claimed in claim 10, wherein said oblique surface crosses obliquely to said extending direction of said mesa stripe waveguide when viewed from a direction perpendicular to a sidewall of said mesa stripe waveguide.

13. The optical semiconductor device as claimed in claim 1, wherein said plurality of dummy mesa patterns are formed with an interval of 10 μm or more but not exceeding 50 μm.

14. The optical semiconductor device as claimed in claim 1, wherein said mesa stripe waveguide comprises a lower cladding layer and an upper cladding layer sandwiching an active layer therebetween, said upper cladding layer has a thickness exceeding 1.5 μm in said mesa stripe waveguide.

15. The optical semiconductor device as claimed in claim 1, wherein said exit facet is defined by a (011) surface of the semi-insulating buried semiconductor layer.

16. The optical semiconductor device as claimed in claim 1, wherein said first region and said second region do not overlap.

17. A method for fabricating an optical semiconductor device, said optical semiconductor device comprising:
a semiconductor substrate having a (100) principal surface;
a mesa stripe waveguide formed on a first region of said semiconductor substrate, said mesa stripe waveguide guiding a light therethrough in a forward direction to an end face of said mesa stripe waveguide, said mesa stripe waveguide amplifying a light guided therethrough by stimulated emission;
a plurality of dummy mesa patterns, that do not actively amplify light, formed on said semiconductor substrate in a second region having a exit facet, said second region being located at a forward side of said first region, said exit facet determining an edge surface of said optical semiconductor device, each of said plurality of dummy mesa patterns extending to said exit facet, a gap being formed between said plurality of dummy mesa patterns in said second region; and a semi-insulating buried semiconductor layer formed on said semiconductor substrate so as to cover said first and second regions continuously, said semi-insulating buried semiconductor layer filling a right side and a left side of said waveguide mesa stripe in said first region;

said semi-insulating buried semiconductor layer having a height equal to a height of said dummy mesa patterns, said method comprising the steps of:

depositing a semi-insulating semiconductor layer on said semiconductor substrate by an MOCVD process so as to cover said first region and said second region continuously, such that said semi-insulating buried semiconductor layer fills, in said first region, a right side region and a left side region of said mesa stripe waveguide and such that said semi-insulating buried semiconductor layer fills, in said second region, a gap between said plurality of dummy mesa patterns, said step of depositing said semi-insulating buried semiconductor layer being conducted by adding an organic chlorine-containing substance such that there are formed flat regions in said first region along said mesa stripe waveguide respectively at said right and left regions of said mesa stripe with a flat surface at a level coincident to a top surface of said mesa stripe waveguide, and such that there are formed first and second sloped regions at respective outer sides of said flat regions with respective thicknesses decreasing with increasing distance from said mesa stripe waveguide, said step of depositing said semi-insulating buried semiconductor layer being further conducted such that, in said second region, said semi-insulating buried semiconductor layer fills said gap between said plurality of dummy mesa patterns with a thickness equal to a height of said plurality of dummy mesa patterns.

18. The method as claimed in claim 17, wherein said exit facet is defined by a (011) surface of the semi-insulating buried semiconductor layer.

19. The method as claimed in claim 17, wherein said first region and second region do not over lap.

* * * * *